United States Patent
Chen et al.

[11] Patent Number: 6,166,322
[45] Date of Patent: *Dec. 26, 2000

[54] ENCAPULATION PROCESS FOR MONO-AND POLYCRYSTALLINE SILICON SOLAR CELL MODULES

[75] Inventors: Chih-Chiang Chen; Jing-Pin Pan, both of Hsinchu, Taiwan

[73] Assignee: Industrial Technology Research Institute, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/292,873

[22] Filed: Apr. 16, 1999

[51] Int. Cl.$^7$ .......................... H01L 31/048; H01L 31/05
[52] U.S. Cl. .......................... 136/251; 136/244; 136/256
[58] Field of Search .................. 136/244, 251, 136/259, 261, 256; 257/443, 446, 448, 459

[56] References Cited

U.S. PATENT DOCUMENTS

| | | | |
|---|---|---|---|
| 4,362,895 | 12/1982 | Gupta et al. | 136/256 |
| 4,636,578 | 1/1987 | Feinberg | 136/251 |
| 4,749,430 | 6/1988 | Samuelson et al. | 156/244 |
| 5,476,553 | 12/1995 | Hanoka et al. | 136/251 |
| 5,578,142 | 11/1996 | Hattori et al. | 136/251 |
| 5,582,653 | 12/1996 | Kataoka et al. | 136/251 |
| 5,660,646 | 8/1997 | Kataoka et al. | 136/251 |
| 5,684,325 | 11/1997 | Kataoka et al. | 257/433 |
| 5,718,772 | 2/1998 | Mori et al. | 136/251 |
| 5,800,631 | 9/1998 | Yamada et al. | 136/251 |

OTHER PUBLICATIONS

H.S. Rauschenbach, Solar Cell Array Design Handbook, Van Nostrad Reinhold Company, p. 161, 1980.

Primary Examiner—Ellis Robinson
Assistant Examiner—Michael C. Miggins
Attorney, Agent, or Firm—W. Wayne Liauh

[57] ABSTRACT

A crystalline silicon based solar cell module comprising: (a) a crystalline silicon based solar cell array formed by interconnecting a plurality of crystalline silicon based solar cells with an interconnect; (b) a hot melt adhesive applied above and below the interconnect to reduce mechanical and thermal stress between the interconnect and the crystalline silicon based solar cells. The hot melt adhesive can be an ethylene-polymer along with a variety of additives such as oxidation inhibitor, UV stabilizer, and UV absorber.

13 Claims, 1 Drawing Sheet

ENCAPULATION PROCESS FOR MONO-AND POLYCRYSTALLINE SILICON SOLAR CELL MODULES

FIELD OF THE INVENTION

The present invention relates to a method for the encapsulation of mono- and polycrystalline silicon solar cell modules wherein adjacent solar cells are connected by an interconnect. More specifically, the present invention relates to an improved process for encapulating mono- and polycrystalline silicon solar cells into a modular structure by minimizing the mechanical and thermal stresses between the mono- and polycrystalline silicon solar cell and the interconnects, as well as between the solar cells and the terminals, so as to avoid the need to welding flux or tin/silver solder paste, which often caused oxidation and corrosion problems in the solar cells and/or electrodes. The present invention also relates to the improved encapsulated solar cell modules prepared according to the novel method.

BACKGROUND OF THE INVENTION

Fossil energy has been the most important and indeed the overwhelmingly dominating energy source. While the exhaustiblility of the fossil energy has been gradually ignored as our memory of energy crisis, which peaked in the late 1970's, gradually faded away. However, the use of fossil energy also posses another imminent problem, i.e., the global warming effect. It has been reported that the use of fossil energy has contributed to an increase in the carbon dioxide content in the atmosphere of about 1 ppm per year. This also causes the concern of the so-called green house effect.

The use of inexhaustible solar energy has been a topic of great interest. A solar cell can convert solar energy into electrical energy in a safe, convenient, pollution-free, and, theoretically, very inexpensive manner. The majority of the cost in installing a solar cell system is in the capital cost. The acceptability of solar cells depends on whether we can reduce the manufacturing cost thereof, and prolong its service life. The latter not only is directly related to the overall cost of using a solar cell system, it also prevents the problem of causing another type of pollution resulting from waste disposal.

Because the energy output from a single solar cell is very limited, typically a plurality of solar cells are connected together via interconnects to form a solar cell module. A solar cell module, which can produce from tens to thousand watts of electrical power output, thus constitutes the basic unit of solar cell systems. A solar cell system can consist of tens or thousand of solar modules. Some commercial solar cell systems can produce tens to tens of millions or even billions of watts of power output.

In order to minimize the environmental effects, such as "sunshine", rain, humidity, hail, snow, dust, and day-night and seasonal temperature changes, the solar cell systems, which include the solar cell modules and the connecting interconnects, are typically encapsulated, and the solar cells are made from mono- or polycrystalline silicon materials to form C—Si solar cell modules. This protective requirement is even more stringent for middle and large scale direct and alternating power supplies, as well as in communications and satellite applications.

In the manufacturing of a C—Si solar cell, which typically comprises a silver pad, wafer, and an anti-reflection coating on a polished semiconductive crystalline silicon material, silicon nitride has been used to form the anti-reflecting layer via deposition procedure. The thickness of the anti-reflection layer is approximately 700 Å. This thickness causes a near-dark-blue color to be exhibited on the crystalline silicon substrate, so as to facilitate effective absorption of light by the solar cell.

Silicon nitride has many advantages for use in making solar cells, most notably its excellent chemical and mechanical strengths. However, the chemical inertness of silicon nitride makes it relatively difficult to weld interconnects on the silicon nitride surface. Typically, a flux is required to be applied on the interconnects during the welding process to improve the weld strength. Unfortunately, the use of flux in welding interconnects to the silicon nitride surface also introduces another problem in that the flux can cause oxidation or corrosion in the solar cell and/or the electrodes. This can adversely affect the energy conversion efficiency as well as the reliability and stability of the solar cells. Thus, the issue as to how to best encapsulate the solar module so as to provide the intended protection against environmental factors while improving its service life and reliability and stability, remains an important subject.

The idea of using adhesives in making solar cell modules has been largely ruled out because, after the adhesive is cured and hardened, it can be easily cracked under thermal or mechanical stress, thus rendering the application of adhesive useless. As a result, research and development efforts have focused on other aspects of solar cell manufacturing. For example, U.S. Pat. No. 4,173,820 disclosed a method for forming flexible solar array strips. U.S. Pat. No. 5,006,179 disclosed an improved solar cell interconnect with increased life expectancy when subjected to extended periods of severe thermal cycling. U.S. Pat. No. 5,074,920 disclosed a photovaltic cell with improved thermal stability by providing a silver thick film which are electrically interconnected to the photovaltic using a tin/silver solder paste to solder the silver thick film. The use of tin/silver solder paste could cause oxidation and/or corrosion problems.

SUMMARY OF THE INVENTION

The primary object of the present invention is to develop an improved process for the encapsulation of mono- or polycrystalline silicone solar cell modules. More specifically, the primary object of the present invention is to develop an improved process which reduces the thermal and mechanical stress between the silicon solar cells and the interconnects so that the silicon solar cells which contain a silicon nitride anti-reflection layer can be welded with interconnects during encapsulation using conventional welding materials without the use of potentially reactive weld flux or tin/silver solder paste. The method disclosed in the present invention allows the cost for manufacturing solar cell systems to be reduced while retaining high quality thereof; it also enhances the service life as well as the reliability and stability thereof. The solar cell systems made from the method of the present invention exhibit high energy conversion efficiency and high output power.

In the present invention, a layer of hot melt adhesive is applied around the portion of the interconnect which is welded to the silicon based solar cell and extending to the solar cell surface so as to reinforce the adhesion and reduce the thermal and/or mechanical stress between the interconnect and the solar cells connected thereto. Unlike conventional adhesives, the hot melt adhesive, which provides many of the adhesion characteristics of conventional adhesives, maintains certain degree of softness, or flexibility, after it is cured. In short, a hot melt adhesive suitable for the present invention can be considered as a bubble gum with a much stronger adhesiveness; it must also provide high degrees of electrical insulation, optical coupling, mechanical (tensile and compressive) strength, heat conduction, and light transmissivity. Many commercially available hot melt adhesives can be used in the present invention. A preferred hot melt adhesive is an ethylene-copolymers which exhibits excellent adhesive characteristics, heat transmission, and softness over a wide temperature range, including the temperature range of interest. Other types of hot melt adhesives include those that are made of polyolefin, thermal plastic rubber, polyurethane, polyvinyl butyral, and polyester. In the present invention, if non-cross-linkable polymers are used, the step of curing the polymer means melting the hot melt adhesive so that it will effectively covering the surfaces of the interconnect and the affected portions of the solar cells, and thus filling the cavities. Furthermore, depending on their molecular weight, side chain characteristics and other factors, many polymers can be used to prepare either hot-melt and non-hot-melt, only non-hot-melt adhesives can be used in the present invention.

A number of additives, such as oxidation inhibitor, UV stabilizer, UV absorber, etc., can be added to the hot melt adhesive to further improve its application for use in encapsulating solar cell modules. Preferred example of oxidation inhibitor includes phosphite derivatives such as (mono-nonylphenyl) phosphite, preferred UV stabilizer includes bis(2,2,2,2-tetramethyl-4-piperidinyl) sebacate, preferred UV absorber includes 2-hydroxy-4-noctylexybenzophenone. These additives can improve the adhesive characteristics, stablilty, and antioxidibility at elevated temperatures.

The Si—C solar cell module to be made from the process of the present invention typically consists of a three layer structure. The top layer is called a superstrate, which typically is a heat-treated tempered safety glass. The main function of the superstrate is to allow light to pass therethrough in an unimpeded manner. The bottom layer is called a substrate, which typically is a weather resistant and chemically inert polymer film such as Tedlar having a thickness between about 1.0 mil and about 2.0 mil (one mil is $\frac{1}{1,000}$ of an inch). The substrate must be able to withstand long term photothermal oxidation and hydrolysis associated with weathering and exposure to sunlight. The middle layer contains the array of solar cells interconnected by interconnects and "reinforced" by the hot melt adhesive. An encapsulation layer, which typically comprises ethylene vinyl acetate, or EVA, is provided between the interconnected solar cell array and the superstrate, and between the interconnected solar cell array and the substrate.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

Figure 1:
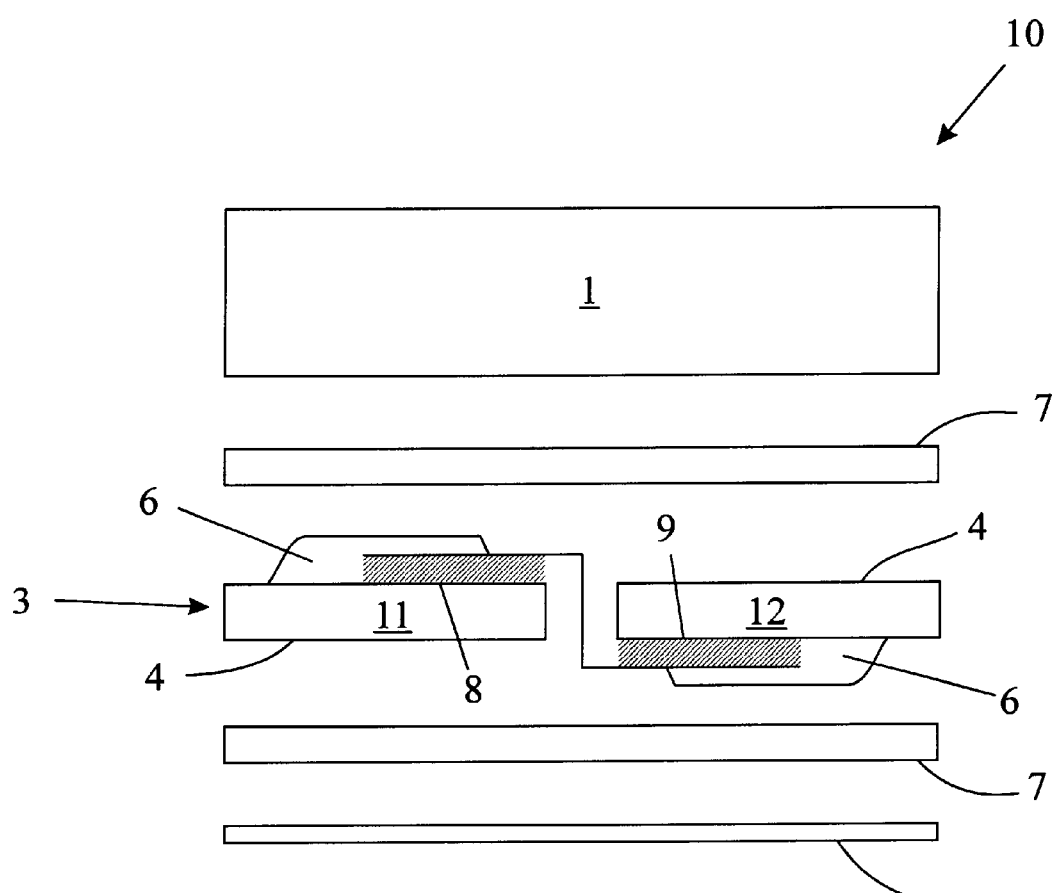
FIG. 1 is a schematic separated cross-sectional view of a representative portion of the solar cell modular prepared according to a preferred embodiment of the present invention.

The present invention discloses an improved process for the encapsulation of mono- or polycrystalline silicone solar cell modules. In the present invention, a layer of hot melt adhesive is applied around the interconnect which reduces the thermal and/or mechanical stress between the interconnect and the solar cells connected thereto. Such a thermal or mechanical stress can become profound after repeated cycles of temperature changes and upon long term exposure to sunlight.

As discussed earlier, one of shortcoming of using silicon nitride in solar cells is that it is relatively difficult to weld interconnects on the silicon nitride surface. Typically, a flux is required on the interconnects which can often cause oxidation or corrosion in the solar cell and/or the electrodes and adversely affect the energy conversion efficiency as well as the reliability and stability of the solar cells. The use of adhesives in making solar cell modules has been largely ruled out because, after the adhesive is cured and hardened, it can be easily cracked under thermal or mechanical stress, thus rendering the application of adhesive useless.

In the present invention, hot melt adhesive is applied around the interconnect to reduce the thermal and mechanical stress that may be exerted thereupon. Unlike conventional adhesives, the hot melt adhesive, which provides many of the adhesion characteristics of conventional adhesives, maintains certain degree of softness, or flexibility, after it is cured. Thus it will not crack under thermal stress. A hot melt adhesive suitable for the present invention is similar to a bubble gum with a much stronger adhesiveness as well as possessing high degrees of electrical insulation, optical coupling, mechanical (tensile and compressive) strength, heat conduction, and light transmissivity. Many commercially available hot melt adhesives can be used in the present invention. A preferred hot melt adhesive is an ethylene-copolymer which exhibits excellent adhesive characteristics, heat transmission, and softness over a wide temperature range, including the temperature range of interest. Other polymers including polyolefin, thermal plastic rubber, polyurethane, polyvinyl butyral, and polyester that exhibit the desired hot melt adhesive characteristic can also be used in the present invention.

The present invention also discloses a method for preparing crystalline silicon based solar cell module; it comprising the steps of:

(a) forming a crystalline silicon based solar cell array by interconnecting a plurality of crystalline silicon based solar cells with an interconnect;

(b) applying a hot melt adhesive on and around the portion of the interconnect which is welded to the silicon based solar cell, wherein the application of the hot melt adhesive is extended to the solar cell surface, so as to reinforce the adhesion and reduce the thermal and/or mechanical stress between the interconnect and the crystalline silicon based solar cells;

(c) sandwiching the crystalline silicon based solar cell array with the hot melt adhesive applied thereon between a substrate, which contains a weather-resistant polymer, and superstrate, which contains a light transmitting safety glass to form a sandwiched structure;

(d) laminating the sandwiched structure to form a laminated structure;

(e) curing the laminated structure including the hot melt adhesive.

In step (e) of the present invention, if non-cross-linkable polymers are used, the step of curing the polymer means melting the hot melt adhesive so that it will effectively covering the surfaces of the interconnect and the affected portions of the solar cells, and thus filling the cavities.

FIG. 1 is a schematic separated cross-sectional view of the solar cell module 10 prepared according to a preferred embodiment of the present invention. The top layer, or the superstrate, 1, is a heat-treated tempered safety glass, which allows light to pass therethrough in an unimpeded manner. The bottom layer, the substrate, 2, is a Tedlar film, which is a weather resistant and chemically inert polymer. The substrate has a thickness between about 1.0 mil and about 2.0 mil. The middle layer 3 contains an array of solar cells 4 interconnected by interconnects 5 and is reinforced by the hot melt adhesive 6. The interconnect 5 is welded onto the top contact 8 and the rear contact 9 of two adjacent silicon cells 11 and 12, respectively. The separation between the interconnect 5 and the top or rear contact indicates that the interconnect is welded. No flux is used in the welding. A plurality of silicon cells can be connected in series.

An EVA encapsulation layer is provided between the interconnected solar cell array 3 and the superstrate 1, and between the interconnected solar cell array 3 and the substrate 2. A number of additives, such as oxidation inhibitor, UV stabilizer, UV absorber, etc., can be added to the hot melt adhesive to further improve its application for use in solar cell modules. Preferred example of oxidation inhibitor includes phosphite derivatives such as (mono-nonylphenyl) phosphite, preferred UV stabilizer includes bis(2,2,2,2-tetramethyl-4-piperidinyl) sebacate, preferred UV absorber includes 2-hydroxy-4-noctylexybenzophenone. These additives can improve the adhesive characteristics, stablilty, and antioxidibility at elevated temperatures.

The method disclosed in the present invention allows the interconnects to be stably welded to the silicon-nitride-based solar cells during the encapsulation process using conventional welding materials and without the use of potentially reactive weld flux or tin/silver solder paste. The present invention allows the cost for manufacturing of high quality solar cell systems to be lowered; it also enhances the service life as well as the reliability and stability thereof. The solar cell systems made from the method of the present invention exhibit excellent energy conversion efficiency and high output power.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

A safety glass having a thickness of 3.2 mm was washed with acetone and baked inside a 100–120° C. oven for 10 minutes. Soldering iron was used to weld interconnects onto the rear contact and top contact of two adjacent monocrystalline silicon cells as shown in FIG. 1. Twelve of such silicon cells are connected in series. A ethylene-copolymer hot melt adhesive is coated about the interconnect. A pair of EVA layers 7 are then placed above and below the solar cell array, respectively. Final the components as shown in FIG. 1 including the Tedlar substrate were placed inside a vacuum laminator and laminated at 110° C. for 8 to 10 minutes, then baked in a 150° C. oven for 10 to 30 minutes for curing and final encapsulation. Thereafter, the solar cell module so prepared was cooled to room temperature for reliability and stability tests, such as standard output power, electrical insulation, weatherability, mechanical strength, etc. These tests are summarized in the following Table 1.

TABLE 1

| Test Type | |
|---|---|
| Standard Output Power | Test under a standard test condition (STC): solar cell module temperature: 25 ± 2° C.; relative humidity: ≦75% R.H.; exposure energy: 1,000 W/m$^2$; the P$_{max}$ obtained from the test IV curve is the standard output power. |
| Mechanical Loading Test | A pressure of 2,400 Pa was placed upon the top face of the solar cell module for one hour. Then the same pressure of 2,400 Pa was placed upon the bottom face of the solar cell module for another hour. Thereafter, the solar cell module was test for its standard output power. The solar cell module was considered acceptable if the difference in standard output power was less than 5% and the insulation resistance was unchanged. |
| Insulation Resistance Test | Resistance was measured using a high-resistance tester under test conditions of: solar cell module temperature: 25 ± 2° C.; relative humidity: ≦75% R.H.; applied voltage: 500 V; test duration: 1 minute. |
| Thermal Cycling Test | Test was conducted in a constant-temperature and constant-humidity oven. The solar cell module was subject to alternating temperatures of −40° C. for one hour and 85° C. for 4 hours, for 50 cycles. The solar cell module was considered acceptable if the difference in standard output power was less than 5% and the insulation resistance was unchanged. |
| Humidity-Freezing Cycle Test | Test was conducted in a constant-temperature and constant-humidity oven. The solar cell module was subject to alternating temperatures of −40° C. for one hour and 85° C. and 85% R.H. for 4 hours, for 10 cycles. The solar cell module was considered acceptable if the difference in standard output power was less than 5% and the insulation resistance was unchanged. |
| UV Exposure Test | Test condition: 60 ± 5° C., luminance: ≦250 W/m$^2$, total exposure energy: 15 KWh/m$^2$. |

The test results are summarized in Table 2.

TABLE 2

| | Example 1 | Comp. Example 1 |
|---|---|---|
| Initial output power (Watts) | 15.57 | 12.52 |
| Conversion efficiency (%) | 12.90 | 10.48 |
| Output power after 50 thermal cycles: | 15.40 | 12.12 |
| (Loss rate) | (1.1%) | (3.2%) |
| Output power after 10 Humidity-Freezing cycles: | 15.34 | 12.10 |
| (loss rate) | (1.5%) | (3.4%) |
| Output power after mechanical loading test: | 15.60 | 12.50 |
| (loss rate) | (<0.1%) | (<0.1%) |
| Output power after UV Exposure Test: | 15.40 | 11.97 |
| (loss rate) | (1.1%) | (4.4%) |
| Insulation Resistance (MΩ) | 112 | 109 |

COMPARATIVE EXAMPLE 1

A solar cell module was similarly prepared as in Example 1, except that no hot melt adhesive was applied on the interconnects. The solar cell module so prepared was cooled to room temperature for reliability and stability tests. The test results are summarized in the following Table 2.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A crystalline silicon based solar cell module comprising:
   (a) a superstrate layer containing a light transmitting safety glass;
   (b) a substrate layer containing a weather-resistance polymer;
   (c) a crystalline silicon based solar cell array containing a plurality of crystalline silicon based solar cells;
   (d) a plurality of interconnects each being welded to said silicon based solar cells at both ends thereof, wherein each said interconnect electrically connects between a top electrode of one of said silicon based solar cells at one end of said interconnect and a bottom electrode of an adjacent said silicon based solar cell at the other end of said interconnect; and
   (e) a hot melt adhesive applied on both ends of each said interconnect, wherein said hot melt adhesive is applied on and around both ends of said interconnect so as to reinforce an adhesion and reduce mechanical and thermal stresses between each said end of said interconnect and said crystalline silicon based solar cell.

2. The crystalline silicon based solar cell module according to claim 1 wherein said hot melt adhesive comprises an ethylene-copolymer.

3. The crystalline silicon based solar cell module according to claim 2 wherein said hot melt adhesive further comprises an oxidation inhibitor.

4. The crystalline silicon based solar cell module according to claim 3 wherein said oxidation inhibitor is tri(mono-nonylphenyl) phosphite provided at 0.1 to 0.2 wt % of said hot melt adhesive.

5. The crystalline silicon based solar cell module according to claim 3 wherein said UV stabilizer is 2,2,6,6-tetramethyl-4-piperidinyl) sebacate provided at 0.5 to 1.0 wt % of said hot melt adhesive.

6. The crystalline silicon based solar cell module according to claim 2 wherein said hot melt adhesive further comprises a UV absorber.

7. The crystalline silicon based solar cell module according to claim 6 wherein said UV absorber is 2-hydroxy-4-noctyloxybenzophenone provided at 0.5 to 1.0 wt % of said hot melt adhesive.

8. The crystalline silicon based solar cell module according to claim 1 wherein said superstrate layer has a thickness between 2 mm and 5 mm.

9. The crystalline silicon based solar cell module according to claim 1 wherein said superstrate layer has a thickness between 3 mm and 4 mm.

10. The crystalline silicon based solar cell module according to claim 1 wherein said substrate layer has a thickness between 1.0 mil and 2.0 mil.

11. The crystalline silicon based solar cell module according to claim 1 wherein said silicon based solar cell is a monocrystalline silicon cell.

12. The crystalline silicon based solar cell module according to claim 1 wherein said silicon based solar cell is a polycrystalline silicon cell.

13. The crystalline silicon based solar cell module according to claim 1 wherein said interconnects are welded to said silicon based solar cells without using a flux.

* * * * *